United States Patent [19]

Schroeder

[11] 4,328,563
[45] May 4, 1982

[54] HIGH DENSITY READ ONLY MEMORY

[75] Inventor: Paul R. Schroeder, Dallas, Tex.

[73] Assignee: Mostek Corporation, Carrollton, Tex.

[21] Appl. No.: 136,588

[22] Filed: Apr. 2, 1980

Related U.S. Application Data

[63] Continuation of Ser. No. 2,833, Jan. 12, 1979, abandoned, which is a continuation of Ser. No. 894,701, Apr. 10, 1978, abandoned.

[51] Int. Cl.$^3$ .............................................. G11C 17/00
[52] U.S. Cl. .................................... 365/104; 365/182
[58] Field of Search ................ 365/94, 104, 182, 183; 307/205; 357/23, 45

[56] References Cited

U.S. PATENT DOCUMENTS

| 3,657,614 | 4/1972 | Cricchi | 357/24 |
| 4,059,826 | 11/1977 | Rogers | 365/104 |
| 4,084,108 | 4/1978 | Fujimoto | 365/182 |

OTHER PUBLICATIONS

Barton et al., "A Cost-Effective 64k CCD Memory," Conference: 1977 Electro Conference Record, New York, (Apr. 19–20, 1977), 3 pages, S74980083v.

*Primary Examiner*—Stuart N. Hecker

[57] ABSTRACT

The disclosed read only memory is formed in a two-dimensional matrix comprised of active areas disposed in parallel columns and of conductive layers disposed in rows transverse to the columns. A field-effect transistor is formed at each intersection of a column and a row. The rows of conductive layers are closely packed so that adjacent transistor channels abut one another.

9 Claims, 11 Drawing Figures

HIGH DENSITY READ ONLY MEMORY

This is a continuation, of application Ser. No. 2833, filed Jan. 12, 1979 now abandoned, which is a continuation of application Ser. No. 894,701, filed Apr. 10, 1978, now abandoned.

BACKGROUND OF THE INVENTION

1. Field of the Invention

The present invention pertains to integrated circuit devices, and more particularly to semiconductor read only memories.

2. Description of the Prior Art

Continuing efforts in the prior art have been directed to the miniaturization of integrated circuit devices. One such integrated circuit device is a read only memory (ROM), which has recently been miniaturized to the point where a single memory bit measures approximately 196 square microns, as reported in the IEEE Journal of Solid-State Circuits, Vol. SC-11, No. 3,6/76, p. 360-364.

FIG. 1 illustrates such a prior art ROM 10, which comprises: a substrate 12 of N-type silicon, conductive layers 14 of polycrystalline silicon ("polysilicon") insulated from the substrate 12 by oxide layers 16, and a protective coating 18 of phosphorus stabilized glass covering the layers 14 and 16 and the substrate surfaces therebetween. Heavily doped regions 20, which are formed by P-type diffusion, are disposed in portions of substrate 12 not covered by layers 14 and 16.

The ROM 10 comprises a series string 22 of P-channel field-effect transistors as illustrated in FIG. 2. The P+ regions 20 provide common source (S) and drain (D) connections between adjacent transistors. The polysilicon layers 14 provide gate (G) electrodes. Selected transistors operate in the depletion mode (DM), while the remaining transistors operate in the enhancement mode (EM). The depletion-mode transistors have ion-implanted channels 24 of P-type conductivity, as shown in FIG. 1.

Binary information is coded in the ROM 10 in the form of the mode type of each transistor, (e.g., depletion mode represents a stored "0"; enhancement mode represents a stored "1"). In order to interrogate a selected transistor to determine its mode type, the impedance of the series string 22 is monitored at $V_{out}$ while all but the selected transistor are caused to conduct. In particular, the gates of the nonselected transistors are held "high", (which is a negative voltage for a P-channel FET, e.g., minus 12 volts). The gate of the selected transistor is caused to go "low" (typically near ground potential). Then a clock pulse causes a reference voltage ($V_{ref}$) to be applied to the series string 22. It an then be determined by the potential at $V_{out}$ whether the selected transistor is conducting (i.e. depletion mode) or nonconducting (i.e. enhancement mode).

A two-dimensional matrix is readily formed using the above techniques by arranging series strings of active transistor regions in parallel columns, wherein transversely running rows of polysilicon layers form common gate electrodes for correspondingly located transistors in each column.

SUMMARY OF THE INVENTION

In accordance with the present invention, a high density memory device is formed in a semiconductor substrate by an arrangement of abutting transistor channels in an active area. The transistors are preset in either a normally conducting mode or a normally nonconducting mode. Means are disposed above the substrate for determning the mode of each transistor.

In a preferred embodiment of the invention, a ROM matrix is formed by arranging parallel columns of seriesed FETs in a substrate. Selected transistors have implanted channels to cause them to operate in the depletion mode, while the remaining transistors operate in the enhancement mode. Conductive layers are disposed in rows running transversely to the columns for accessing each transistor to determine its mode. The conductive layers are closely packed so that adjacent FETs have abutting channels.

The novel features believed characteristic of the invention are set forth in the appended claims. The nature of the invention, however, as well as its essential features and advantages may be understood more fully upon consideration of an illustrative embodiment, when read in conjunction with the accompanying drawings, wherein:

DESCRIPTION OF THE PREFERRED EMBODIMENTS

Figure 3:
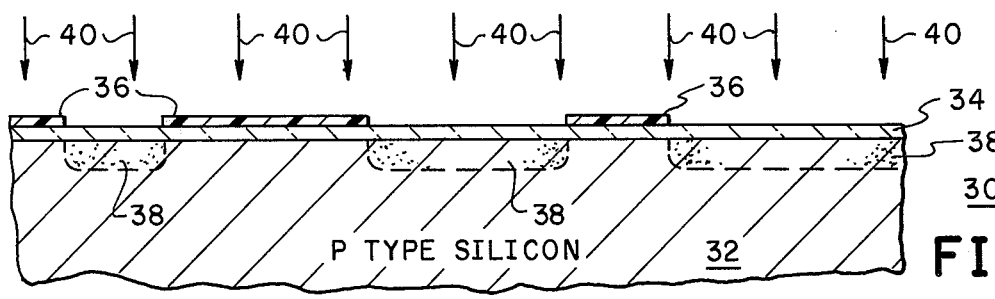
FIGS. 3 through 8 are schematic sectional views illustrating stages in a process for making a device of the present invention.

The present inventon will now be described in detail with reference to FIGS. 3 through 11. Referring particularly to FIG. 3, a partial view of a ROM 30 is shown at an intermediate processing stage. A substrate 32 is prepared for processing in a known manner. The substrate 32 may be any suitable semiconductor material; however, P-type silicon will be used to illustrate the invention. A thin insulating layer 34 is formed on the substrate 32 preferably by oxide growth. Disposed in a predetermined pattern on oxide layer 34 is a mask 36 which is used in the selective formation of implanted regions 38, which in this case comprise an N-type impurity. The N-type regions 38 ae formed using known ion implanation techniques as schematically represented by the arrows 40. A preferred N-type impurity is phosphorus, which is implanted to a concentration sufficient to form the channels of depletion-mode FETs, as described in Mai et al, U.S. Pat. No. 3,898,105.

Figure 4:
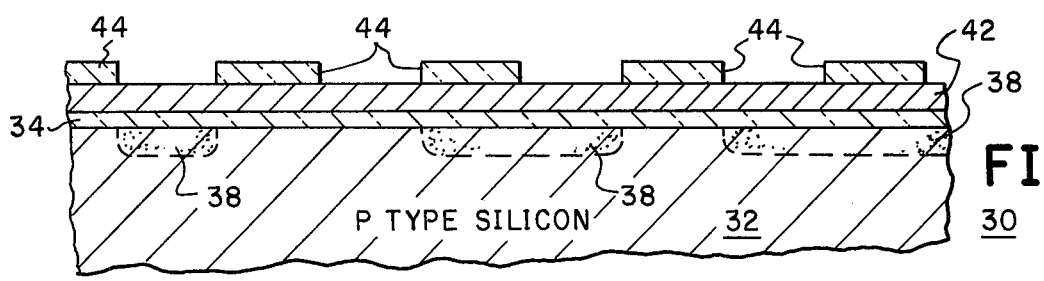

Now referring to FIG. 4, the implant mask 36 has been removed and a conductive layer 42 is formed on the oxide layer 34, preferably by depositing a polysilicon layer and then performing a phosphorus diffusion to cause the polysilicon to become highly conductive. A mask 44 for selectively etching portions of the polysilicon layer 42 is formed thereon in a predetermined pattern. The mask 44 preferably comprises silicon dioxide formed by first exposing the device 30 to an oxidizing ambient for a predetermined duration to partially oxide the polysilicon layer 42, and then selectively etching the resulting oxide layer using a photoresist mask (not shown).

Figure 5:
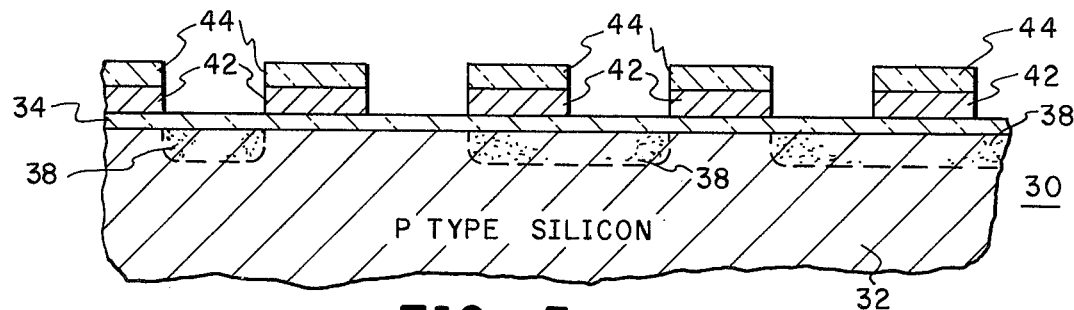

Next, the device 30 is etched with an acid which selectively attacks silicon, thereby removing the portions of polysilicon layer 42 not masked by the oxide 44 to produce a structure as shown in FIG. 5.

Figure 6:
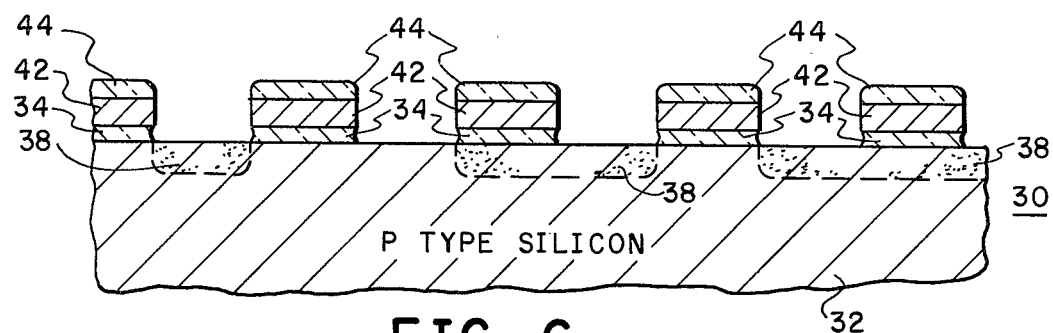

Next, the device 30 is etched with an acid which selectively attacks silicon dioxide, thereby portions of the exposed oxide layers 34 and 44, to produce a structure as shown in FIG. 6. Preferably, the portions of oxide layer 34 not covered by polysilicon layers 42 are etched through to the substrate 32.

Figure 7:
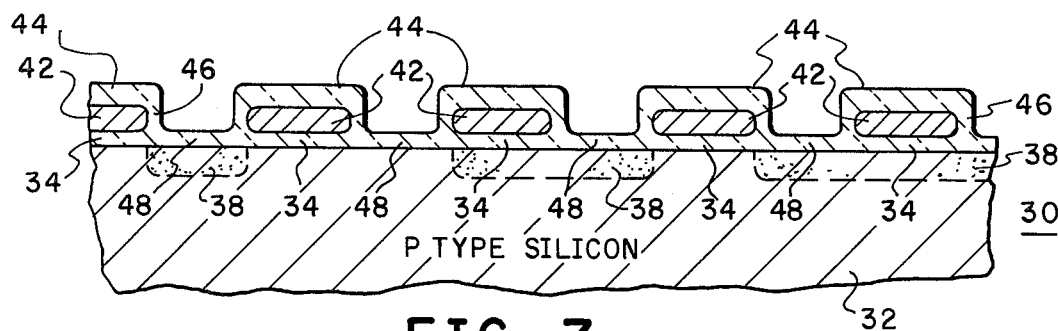

Next, the exposed edges of the polysilicon layers 42 are covered with an insulating material as shown in FIG. 7. Preferably, the device 30 is exposed to an oxidizing ambient which grows oxide portions (typically illustrated by numeral 46) on the edges of polysilicon layers 42, and simultaneously grows oxide on the substrate 32 as indicated by numerals 48 between the polysilicon layers 42. The oxidation is preferably allowed to proceed until oxide layer portions 48 are about equal in thickness to oxide layer portions 34. The purpose of the etching step of FIG. 6 is to prevent the buildup of oxide between polysilicon layers 42 during the edge oxidizing step of FIG. 7.

Figure 8:
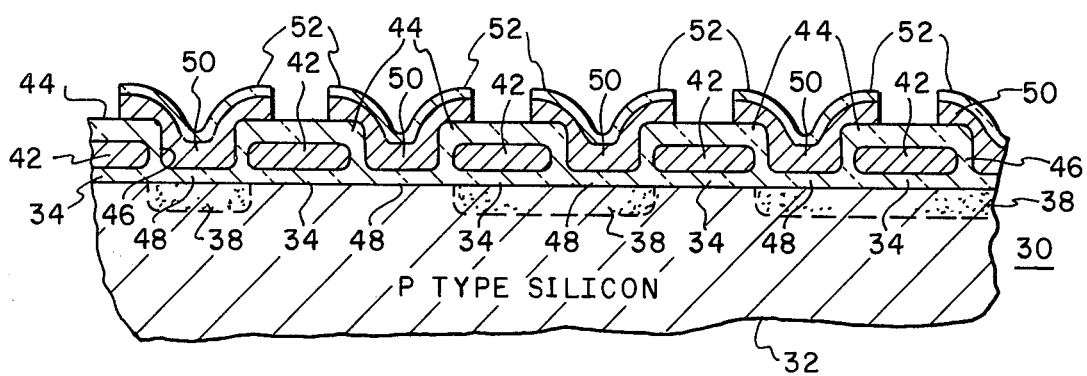

Now referring to FIG. 8, an important feature of the invention is depiced wherein a second group of conductive layers 50 are formed in the spaces between the first group of layers 42. The layers 50 are preferably formed in like manner to the layers 42. In particular, polysilicon is deposited on the structure shown in FIG. 7, the poolysilicon is doped with phosphorus, an oxide layer is grown on the polysilicon, the oxide is masked and etched to produce oxide portions 52, and then the polysilicon is etched into layers 50 using oxide portions 52 as a mask.

Figure 9:
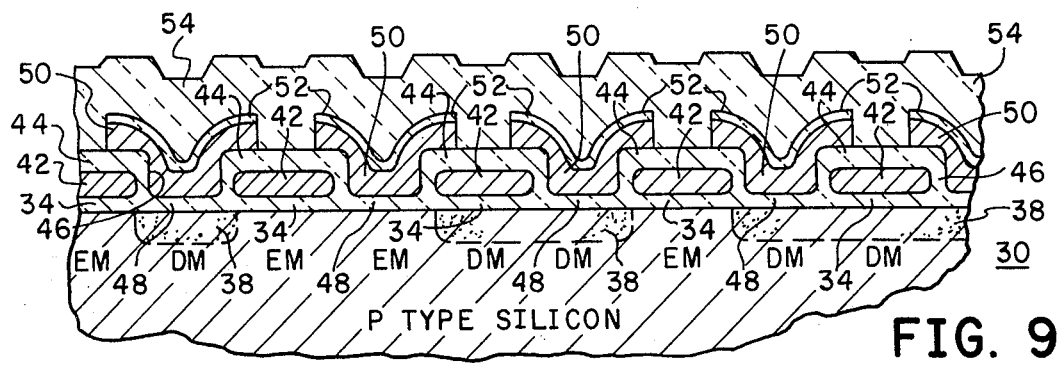
FIG. 9 is a schematic sectional view taken along the IX—IX of FIG. 10.

In order to environmentally passivate the device 30, a protective coating 54 is formed over the exposed surfaces producing the structure of FIG. 9. A preferred material for the coating 54 is phosphorus stabilized glass, which may be formed in a known manner.

The device 30 of the present invention is a read only memory, which operates in a manner similar to the above described ROM 10 of the prior art. As such, a series string of FETs are coded in a predetermined pattern of enhancement mode types and depletion mode types. In order to interrogate a selected FET to determine its mode, all nonselected FETs are gated "high" (which is a positive voltage for an N-channel FET, e.g., plus 12 volts), and the selected FET is gated "low", permitting a determination of whether the selected FET is conducting (depletion mode) or nonconducting (enhancement mode).

Figure 1:
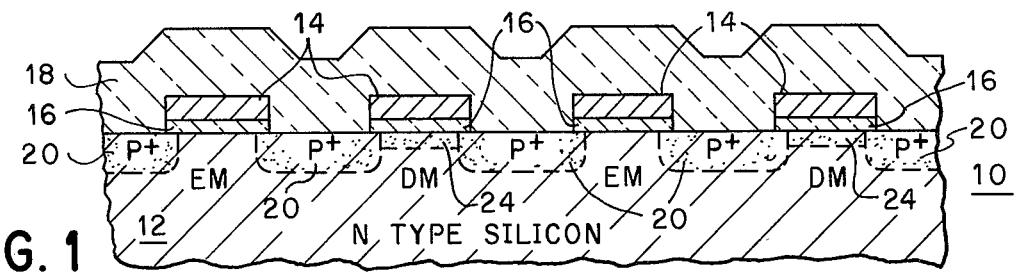
FIG. 1 is a schematic sectional view of a device of the prior art.
Figure 2:
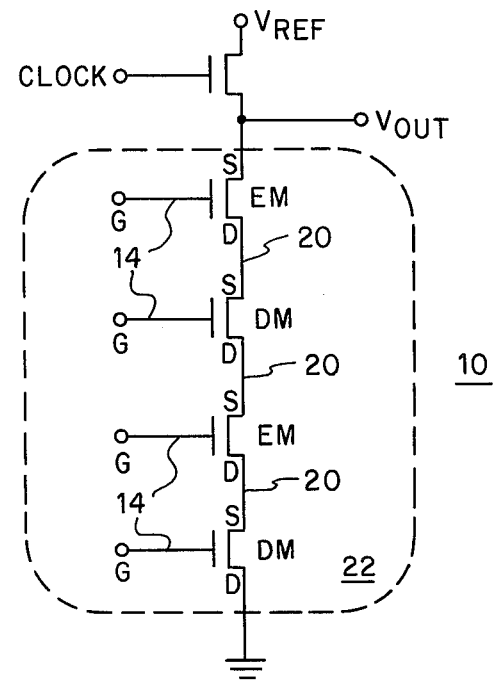
FIG. 2 is a circuit illustrating the operation of the device of FIG. 1.

The ROM 30 of the present invention will be immediately recognized as having twice the density as the ROM 10 of the prior art by comparing FIG. 9 to FIG. 1. The ROM 30 advantageously uses the spaces between transistor channels of the prior art ROM 10, which were devoted to source and drain diffused regions 20. The diffused regions 20 of the prior art are eliminated and channels of a second group of transistors are formed in their place so that adjacent channels abut one another. The second group of polysilicon layers 50 form the gates of the second group of transistors.

Limitations in masking and etching techniques may necessitate forming the second group of polysilicon layers 50 so that they slightly overlap the adjacent polysilicon layers 42 of the first group. In order to render negligible any parasitic capacitance between layers of the two groups, the oxide layers 44 are initially made much thicker than the oxide layer 34. Therefore, when the oxide layer 34 is selectively etched through to the substrate 32 as shown in FIG. 6, a substantial portion of oxide layers 44 will remain to widely separate the overlapping portions of adjacent polysilicon layers.

Figure 10:
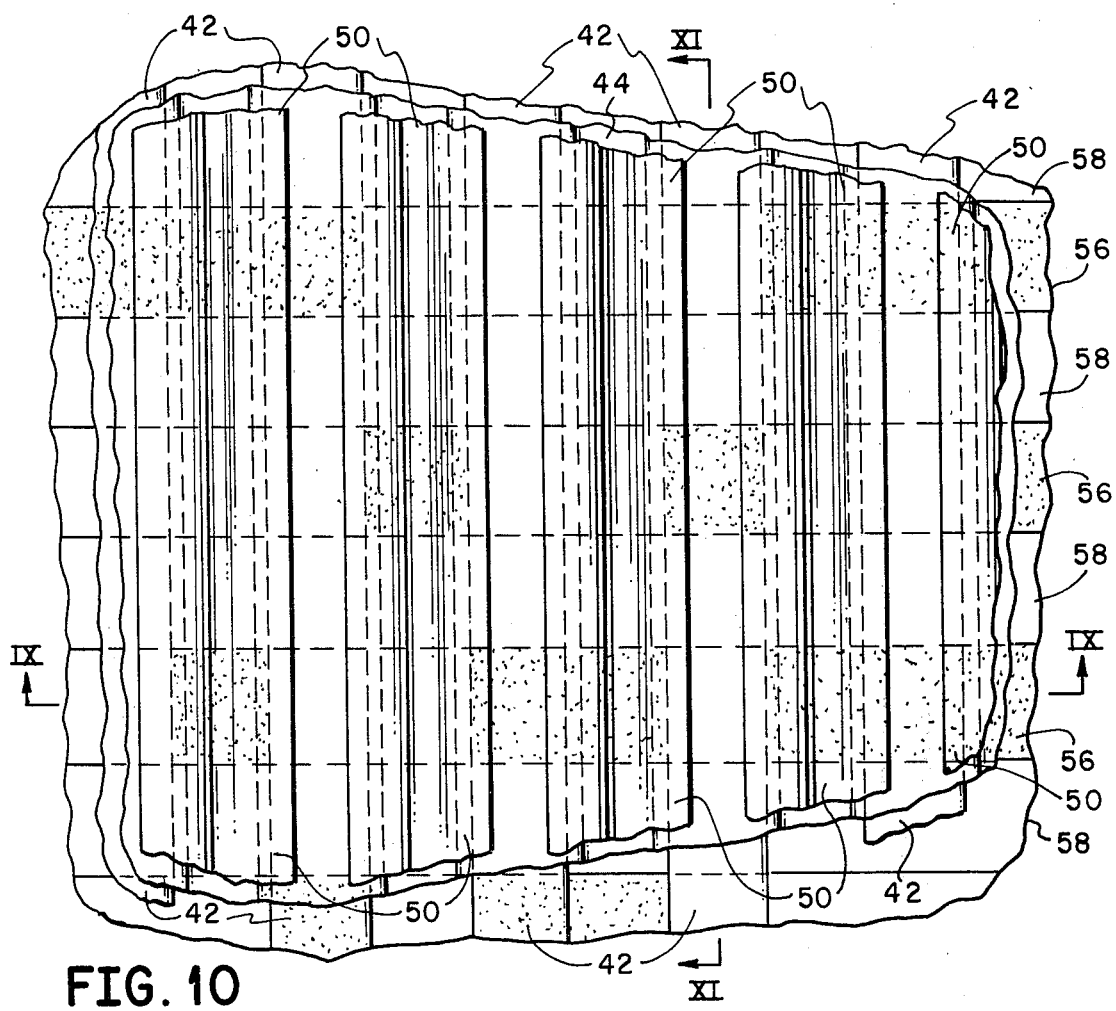
FIG. 10 is a plan view of a device of the present invention at a final processing stage with the various pertinent parts schematically illustrated in a manner permitting visibility of underlying parts; and, FIG. 11 is a schematic sectional view taken along the line XI—XI of FIG. 10.
Figure 11:
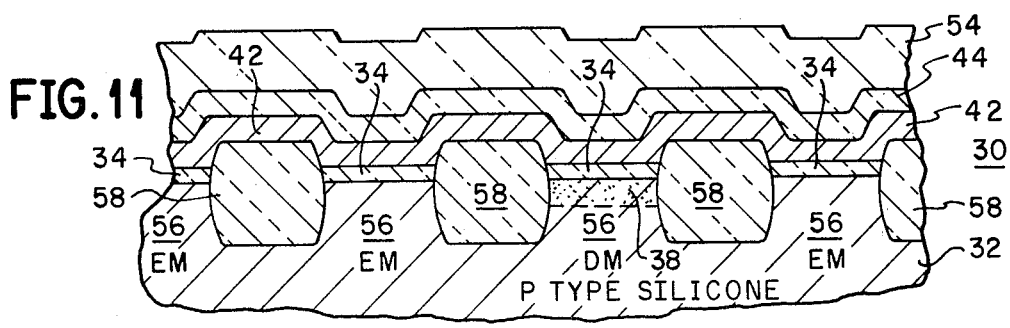

The series string of FETs shown in FIG. 9 may be incorporated into a two-dimensional ROM matrix 30 as shown in FIG. 10. For the sake of clarity, FIG. 10 shows only the polysilicon laers in relationship to underlying substrate regions. The channels of the FETs are arranged in active-area columns 56 which are preferably defined between isoplanar field oxide layers 58 seen clearly in the sectional view of FIG. 11. Thin oxide layers 34 are formed on the substrate 32 over the columns 56 between the field oxide 58. The sectional view of FIG. 11 is taken through one polysilicon laer 42 of the first group which is seen to provide one row of series-connected gates at each intersection with a column 56. Similarly, all the polysilicon layers 42 of the first group provide rows of series-connected gates at each intersection with a column 56, as seen in the view of FIG. 10. Likewise, all the polysilicon layers 50 of the second group provide rows of series-connected gates at each intersection with a column 56, the rows of the second group alternating with the rows of the first group.

It will readily be apparent to those skilled in the art that the present invention achieves twice the packing density of memory bits, since there are twice the number of transistors, each transistor being the site of a memory bit of the ROM 30.

An ancillary advantage of the close packing density of the rows of conductive layers 42 and 50, which causes adjacent transistor channels to abut one another, is the elimination of diffused source and drain regions. In effect, each transistor uses neighboring channels as its source and drain.

Although a preferred embodiment of the invention has been described in detail, it is to be understood that various changes, substitutions and alterations can be made therein without departing from the spirit and scope of the invention as defined by the appended claims.

What is claimed is:

1. A ROM matrix comprising:
    a semiconductor substrate,
    a plurality of columns of seriesed FETs disposed in parallel in the substrate, certain FETs having implanted channels causing them to operate in the depletion mode, the remaining FETs being operable in the enhancement mode, and
    a plurality of conductive layers disposed in rows transverse to the columns for accessing each FET to determine its mode, the conductive layers being closely packed so that adjacent FETs have abutting channels.

2. The ROM matrix of claim 1 wherein the conductive layers comprise heavily doped polysilicon.

3. A ROM matrix comprising:
    a silicon substrate of a first conductivity type,
    a plurality of parallel columns of active areas disposed in the substrate,
    a first oxide layer disposed on the substrate above the columns, a first group of doped polysilicon layers disposed on the first oxide layer in regularly spaced rows transverse to the columns, a second oxide layer disposed over the first polysilicon layers, a second group of rows of doped polysilicon layers insulated from the substrate and from the first polysilicon layers by the oxide layers, the second polysilicon layers being disposed in the spaces in between the rows of the first polysilicon layers, a plurality of depletion mode field-effect transistors formed at selected intersections of the rows and columns, and a plurality of enhancement mode field-effect transistors formed at the nonselected intersections.

4. The ROM matrix of claim 3 wherein the second polysilicon layers partially overlap the first polysilicon layers.

5. The ROM matrix of claim 3 wherein the depletion mode transistors have channels of implanted impurities of a second conductivity type.

6. The ROM matrix of claim 3 wherein adjacent transistors in the columns have abutting channels.

7. A method for making a ROM comprising the steps:
(a) providing a semiconductor substrate of a first conductivity type,
(b) defining columns of active areas in the substrate,
(c) selectively forming transistor channels of a second conductivity type in the columns,
(d) forming a first group of conductive layers insulated from the substrate and disposed in regularly spaced rows transverse to the columns, and
(e) forming a second group of conductive layers insulated from the substrate and from the first group and covering the spaces between the rows of the layers of the first group.

8. The method of claim 7 wherein in step (c) the transistor channels of the second conductivity type are formed by ion implantation.

9. The method of claim 7 wherein the conductive layers are formed by depositing polysilicon and selectively etching the polysilicon into rows, and the second group of layers are insulated from the first group by an oxide layer grown on the layers of the first group.

* * * * *